(12) United States Patent
Cunningham et al.

(10) Patent No.: US 6,940,010 B2
(45) Date of Patent: Sep. 6, 2005

(54) ELECTROMAGNETIC INTERFERENCE SHIELD AND METHOD OF MAKING THE SAME

(75) Inventors: Robert Cunningham, Plano, TX (US); Robert Grange, San Diego, CA (US)

(73) Assignee: Nokia Corporation, Espoo (FI)

( * ) Notice: Subject to any disclaimer, the term of this patent is extended or adjusted under 35 U.S.C. 154(b) by 47 days.

(21) Appl. No.: 10/609,897

(22) Filed: Jun. 30, 2003

(65) Prior Publication Data

US 2005/0006119 A1 Jan. 13, 2005

(51) Int. Cl.[7] .................................................. H05K 9/00
(52) U.S. Cl. .............................. 174/35 R; 174/35 MS; 361/818; 455/117
(58) Field of Search .......................... 174/35 R, 35 MS, 174/35 GC; 361/799, 800, 816, 818, 752, 753; 455/90, 117, 575; 343/702, 841

(56) References Cited

U.S. PATENT DOCUMENTS

| | | | |
|---|---|---|---|
| 5,177,324 A | | 1/1993 | Carr et al. |
| 5,596,487 A | * | 1/1997 | Castaneda et al. ........... 361/814 |
| 6,243,274 B1 | * | 6/2001 | Willis .......................... 361/816 |
| 6,275,683 B1 | * | 8/2001 | Smith ........................ 455/575.1 |
| 6,426,881 B1 | | 7/2002 | Kurz |
| 6,576,832 B2 | | 6/2003 | Svarfvar et al. |

OTHER PUBLICATIONS

Werner, Douglas H. and Ganguly, Suman, "An Overview of Fractal Antenna Engineering Research", IEEE Antennas and Propagation Magazine, vol. 45, No. 1, Feb. 2003, pp. 38–57.

* cited by examiner

*Primary Examiner*—Dean A. Reichard
*Assistant Examiner*—Carmelo Oliva
(74) *Attorney, Agent, or Firm*—Alston & Bird LLP; Arjun Krishnan (57) ABSTRACT

An EMI shield for blocking and dissipating electromagnetic interference. The EMI shield includes a primary conductive member having a plurality of catches extending into a plurality of receptacles defined in an absorptive member so as to firmly connect the members. Advantageously, the absorptive member is sufficiently solid to be retained against the primary conductive member during normal use. In addition, the absorptive member is constructed of materials capable of withstanding a temperature range of 139° C. to 260° C. associated with most soldering operations. In this manner, the conductive and absorptive members can be attached prior to soldering of the EMI shield to electronic circuitry of a mobile station. The catches may have sharp edges allowing the absorptive member to be pressed onto the catches.

26 Claims, 4 Drawing Sheets

ELECTROMAGNETIC INTERFERENCE SHIELD AND METHOD OF MAKING THE SAME

BACKGROUND OF THE INVENTION

1. Field of the Invention

The present invention is related to the use of electromagnetic interference (EMI) shields in electronic devices, and more particularly to the use of EMI shields in mobile stations.

2. Description of Related Art.

Electromagnetic interference (EMI) shields are used to attenuate the EMI generated, and otherwise received, by various electronic devices including mobile stations. Generally, shielding materials are capable of reflecting, absorbing or preventing radio frequency signals from either entering or exiting an enclosed area that is surrounded by the shielding material.

Originally, shielding consisted of a sheet of conductive metal material that was effective in shielding against a broad band of electromagnetic radiation. However, as electronic devices became more complex they became more susceptible or likely to generate specific radio frequency signals at higher power levels. For metal shields, effectively shielding such specific frequencies and power levels would require a very thick shield that is prohibitively heavy and bulky for most mobile stations.

More recent versions of EMI shields include a sheet of conductive material and an additional absorptive member combined with the conductive member. The absorptive member attenuates surface currents on the conductive member and absorbs, reflects, breaks up or redirects electromagnetic radiation. Typically, the material properties required to have such effects on electromagnetic radiation include conductivity, dielectric constant and magnetic permeability that are tailored as known to those skilled in the art to attenuate signals having a particular frequency. An absorptive member can generally be formulated with the right materials and structure to provide a high level of shielding within the frequency ranges most susceptible to interference.

For instance, absorptive members may be constructed of a block of silicone, urethane, or other material having absorptive properties that is attached to the conductive member using a pressure sensitive or absorptive adhesive. Alternatively, multiple conductive and absorptive coatings may be applied directly to the conductive member. Attachment of the absorptive member using adhesive or the application of coatings occurs after the conductive member has been soldered to a circuit board of the mobile station so as to avoid the adverse effects of soldering process temperatures.

Despite the advantages provided by shields combining metal conductive members with absorptive materials, adhesive attachment of the absorptive member is prone to failure. In addition, the application of coatings requires repeated coatings and cure time to reach a thickness sufficient to satisfy shielding requirements.

Therefore, it would be advantageous to have an EMI shield including a conductive member and an absorptive member that is easily manufactured. In particular, it would be advantageous if the EMI shield could be constructed without the use of adhesives or multiple applications of coatings.

BRIEF SUMMARY OF THE INVENTION

The present invention addresses the above needs, and achieves other advantages, by providing an improved EMI shield for blocking and dissipating electromagnetic interference. The EMI shield includes a primary conductive member having a plurality of catches extending into a plurality of receptacles defined in an absorptive member so as to firmly connect the members. Advantageously, the absorptive member is sufficiently solid to be retained against the primary conductive member during normal use. In addition, the absorptive member may be constructed of materials capable of withstanding a temperature range of 139° C. to 260° C. associated with most soldering operations. In this manner, the conductive and absorptive members can be attached prior to soldering of the EMI shield to electronic circuitry of a mobile station. In another aspect, the catches have sharp edges allowing the absorbtive member to be pressed onto the catches, thereby advantageously eliminating the need for adhesive attachment or the deposition of an absorptive coating.

In one embodiment, the mobile station of the present invention includes an electromagnetic interference shield for blocking and dissipating electromagnetic interference that includes a primary conductive member. The primary conductive member has a first attachment surface and includes at least one catch extending outwardly from the first attachment surface. An absorptive member has a second attachment surface that is at least partially in contact with the first attachment surface. Defined by the absorptive member is at least one receptacle that has an entrance defined in the second attachment surface. The catch from the primary conductive member extends through the entrance into the receptacle of the absorptive member and the absorptive member is sufficiently solid to be firmly secured on the catch. Preferably, the conductive member includes a plurality of catches extending into a corresponding plurality of receptacles of the absorbing member.

The absorptive member can be constructed of a laminate having layers of conductive and absorptive materials or a resin composite having a combination of conductive and absorptive materials. In another example, the absorptive member is constructed of a conductive mesh encased within a polymer matrix. Alternatively, the absorptive member may be constructed of a non-conductive mesh encased within a conductive foam structure. Preferably, the absorptive member is sufficiently solid for a temperature range associated with soldering processes, such as 139° C. to 220° C., or even 139° C. to 260° C. so as to withstand soldering of the shield to electronic circuitry or other components of the mobile station.

In another aspect, the primary conductive member is a malleable sheet material and the catches are formed by punches. The catches may be formed with sharp edges (such as with a triangular punch) so that the absorptive material can be pressed onto the sharp edges to connect the members while simultaneously forming the receptacles in the absorptive member. The catches may be sufficiently long to extend completely through to an opposite surface of the absorptive member and are bent thereover to further secure the members together. Alternatively, the receptacles may be preformed in the absorptive member, such as by die cutting, water jet drilling, laser drilling, bit drilling or ultrasonically cutting the absorptive member.

In still another alternative, the primary conductive member includes a polymer sheet preformed with the catches extending from the attachment surface. A conductive material is applied to the polymer sheet and catches to provide conductivity.

In another embodiment, the primary conductive member includes at least two catches extending outwardly from the first attachment surface. The absorptive member of this embodiment has at least two opposite edges and each of the catches extends along and in contact with a respective one of the opposite edges so as to firmly hold the members together.

The EMI shield of the present invention has many advantages. For example, the conductive member is firmly attached to the absorptive member using the catches without the use of adhesives or coating and curing processes. In addition, the members can be assembled prior to the soldering processes in some embodiments because of the use of materials for the absorptive member that are tolerant of temperatures as high as 260° C. In addition, the structure and properties of the absorptive member can be varied to selectively shield ranges of EMI frequencies necessary for sophisticated electronic devices, such as mobile stations. The particular structure of the triangular-shaped catches one illustrated embodiment facilitates attachment without pre-cutting of receptacles in the absorptive member.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF THE INVENTION

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Figure 1:
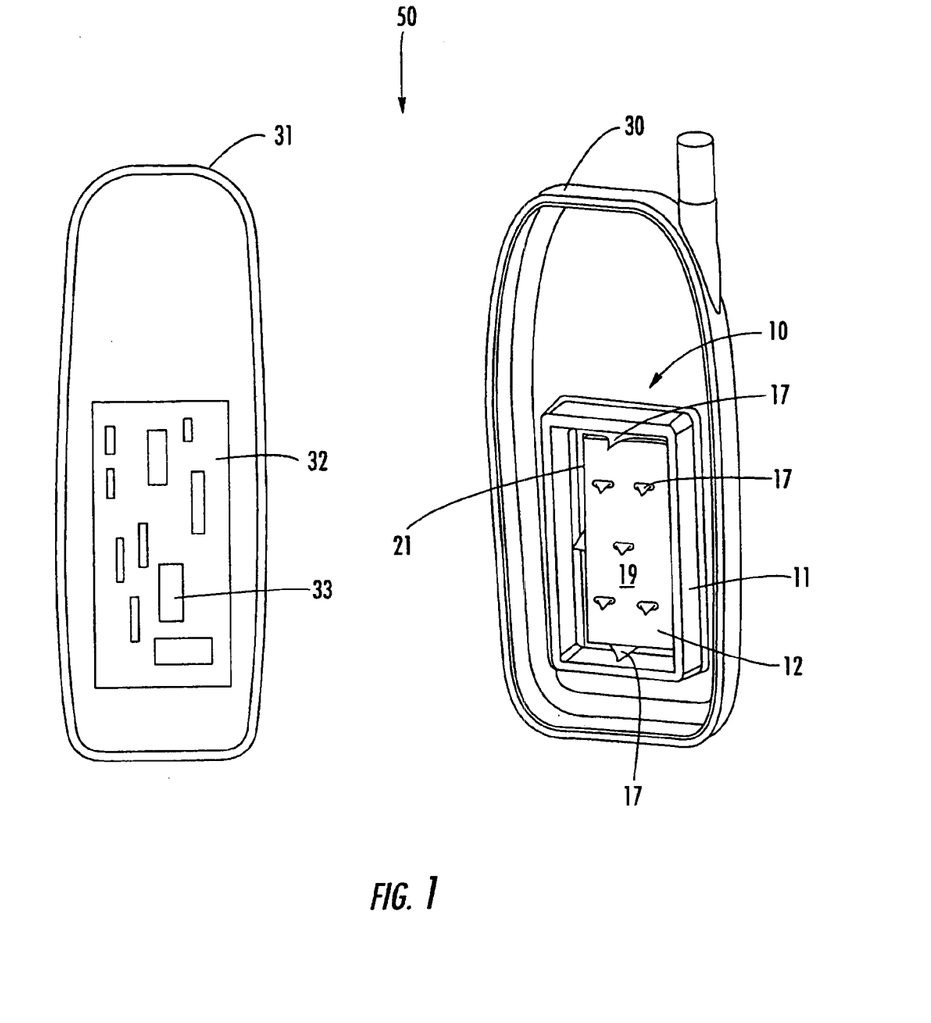
FIG. 1 is an exploded view of a mobile station including an EMI shield of one embodiment of the present invention.

One embodiment of an EMI shield 10 of the present invention positioned in a partially disassembled mobile station 50 is shown in FIG. 1. In particular, the EMI shield is shown connected to a back housing portion 30 of the mobile station which is configured to be fitted to a front housing portion 31 of the mobile station. Once the housing portions are fitted together, the EMI shield 10 is positioned over and electrically connected to a circuit board 32 so as to shield a plurality of electronic components 33. The EMI shield 10 includes a primary conductive member 11 attached to an absorptive member 12 so as to be capable of shielding against signals having a broad range of interference frequencies and one or more narrow ranges of frequencies that have power levels generally higher than remainder of the broad range of frequencies.

The EMI shield described herein may be used in any electronic device, but is preferably used in a mobile station. The EMI shield is preferred for such mobile stations due to its compact size and weight as compared to primarily metal shields which are generally undesirably heavy and bulky for portable devices. Generally, the mobile station 50 discussed herein for use of the EMI shield 10 is a mobile telephone, but such descriptions are illustrative of only one type of mobile station that would benefit from the present invention and, therefore, should not be taken to limit the scope of the present invention.

For example, other types of mobile stations, such as portable digital assistants (PDAs), pagers, laptop computers and other types of voice and text communications systems, can readily employ the present invention. Moreover, the system and method of the present invention will be primarily described in conjunction with mobile communications applications. But the system and method of the present invention can be utilized in conjunction with a variety of other applications, both in the mobile communications industries and outside of the mobile communications industries.

The primary conductive member 11 in the illustrated embodiment includes a generally rectangular flat base surrounded by a peripheral wall structure 14. The peripheral wall structure 14 extends away from a first attachment surface 15 of the base. On the opposite side of the base is an outer surface 16 that is positioned adjacent to the back housing portion 30 of the mobile station 50. The outer surface 16 may be attached to the back housing portion 30, as shown in FIG. 1, so that the wall structure 14 is held in contact with the circuit board 32 when the housings are assembled. In another option, the wall structure 14 may be soldered to the circuit board 32 which obviates the need for attachment at the outer surface 16 to the back housing portion 30. Regardless, some contact is made between EMI shield 10 and the circuit board 32 to establish an electrical connection.

Figure 2:
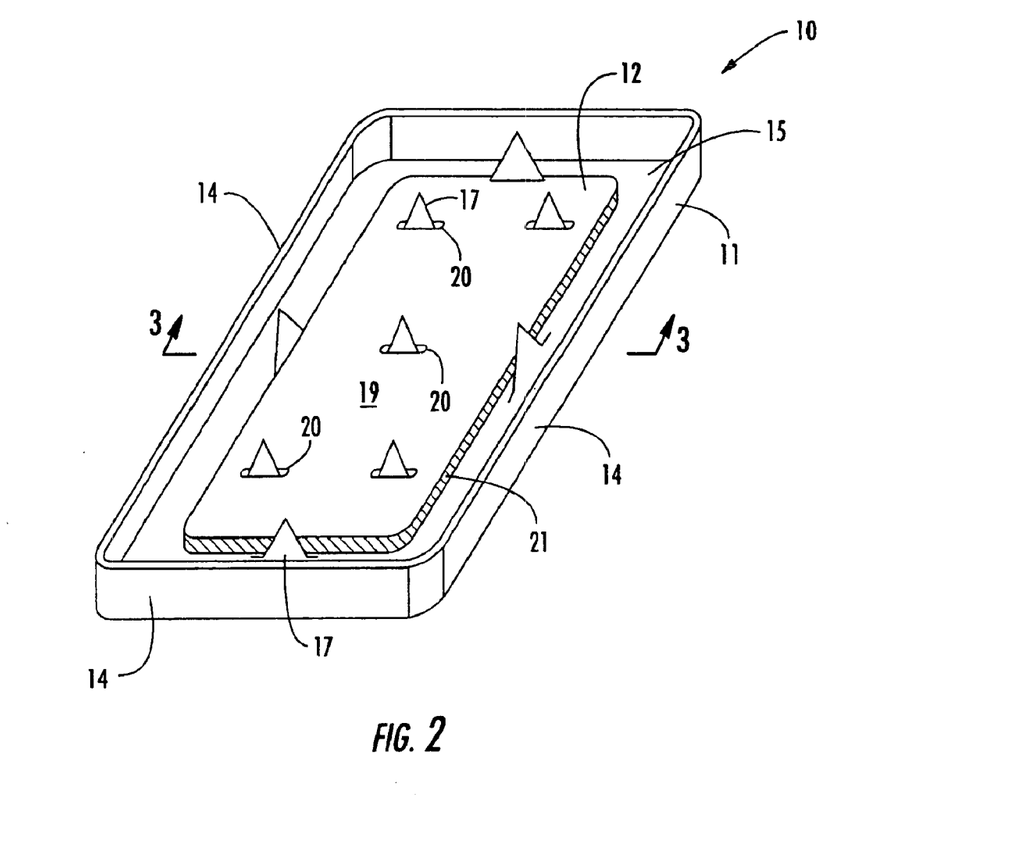
FIG. 2 is a perspective view of the EMI shield shown in FIG. 1
Figure 3:
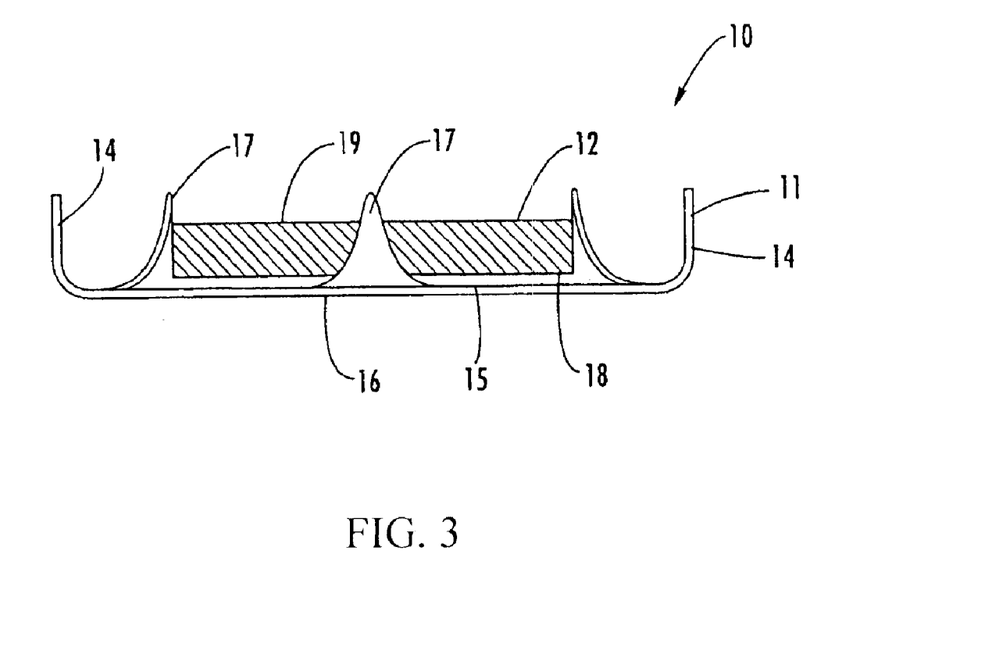
FIG. 3 is a cross-sectional view of the EMI shield shown in FIG. 1.

The rectangular shape of the conductive member 11 illustrated in FIGS. 1–3 is preferred for mobile phone type mobile stations that typically also have a rectangular shaped enclosure and rectangular circuit boards. However, the present invention is not limited to such a shape as different shapes of the conductive member 11 can be used to correspond with the different shapes of electronic circuitry and devices being shielded. For instance, a circular shape could be used for a circular circuit board, or irregular shapes could be tailored to the shapes of one or more circuit boards or electronic circuitry. The shape of the housing, and the amount of clearance therein, is another factor that could affect the shape of the conductive member.

Placement of the EMI shield 10 over the circuit board 32 so that the wall structure 14 is in contact with the circuit board provides an electrically conductive pathway to the electronic components allowing the EMI shield protect against outside EMI and absorb EMI generated by or impinging upon the electronic components. Different types of soldering processes may be used to connect the EMI shield 10 to the circuit board 32 with the present invention even after the conductive and absorptive components 11 and 12 have been connected. For instance, wave flow soldering wherein a liquid solder wave runs across the electronic component boards or re-flow soldering employing convective or forced air can be used, as will be described in more detail below.

Although the EMI shield 10 of the present invention is preferred for use with soldering connections that generate relatively high temperatures, other methods and devices may be employed to establish an electrical pathway between the electronic circuitry and the EMI shield 10. For instance, the EMI shield may include terminals to which conductive wires from the electronic circuitry are connected or conductive tapes or adhesives may connect the EMI shield to the electronic circuitry. The various configurations of the electronic circuitry (which typically would vary with the type of mobile station or other electronic device) and the conductive connections between the EMI shield 10 and the electronic circuitry that do not involve soldering would be performed in a conventional and are therefore are not described herein in additional detail.

Extending away from the first attachment surface 15 are a plurality of barbs or catches 17 that serve to firmly retain the absorptive member 12 against the conductive member 11. Each of the catches 17 in the illustrated embodiment is an outwardly bent portion of the sheet material forming the remainder of the conductive member 11. Each of the illustrated catches 17 has a triangular shape with a pair of free edges ending to a point. Preferably, the catches 17 are formed with a triangular punch applied to the soldering surface 16 of the conductive member 17 so as to cut and bend the triangular shaped portions outwardly from the first attachment surface 15.

As will be described in more detail below for one embodiment of a method of the present invention, the triangular shape and sharp edges of the illustrated catches 17 facilitate using pressure to combine the members 11, 12 to form the EMI shield 10. Such a process involves pressing the absorptive member onto the catches so that the catches penetrate and hold the absorptive member.

Preferably, the conductive member 11 is constructed of a malleable, conductive metal sheet material, such as aluminum or copper, that promotes shielding and allows easy construction of the peripheral wall structure 14 by bending and the illustrated catches 17 using the punching process. Other examples of conductive metal materials include tin, lead, gold, silver, nickel, alone or in combination with each other. For instance, a copper sheet material can be coated with lead, gold, silver, nickel or additional copper. Use of sheet metal allows the conductive member 11 to be relatively light in weight and still provide baseline broad frequency range EMI shielding. As an alternative to a malleable metal conductive member 11, the conductive member may be constructed using a molding process from a synthetic material, such as a polymer or composite. The molded part can then be coated with a conductive material to provide it with shielding capabilities.

Such a molding process would also allow easy construction of alternative shapes and placements of the catches 17. For instance, the catches 17 could be clips biased to press against edges of the absorptive member 12, pegs that extend through the absorptive member, etc. It should be noted, therefore, that the construction of the conductive member 11 and its catches 12 should not be limited to the illustrated embodiment and could be formed of a range of shapes and sizes, as long as a baseline of EMI shielding is provided and the catches firmly retain the absorptive member 12 to the conductive member. It should also be noted that other types of metal materials and non-metal materials than those described above could also be used as long as they have relatively conductive properties that provide a shielding function.

The illustrated embodiment of the absorptive member 12 is a sheet of absorptive material, such as a thermoplastic containing small particles of conductive materials or a laminate with alternating conductive and absorptive layers, that is generally congruent with the rectangular shape of, but somewhat smaller than, the conductive member 11. The absorptive member 12 is centered within the peripheral wall structure 14 and includes a second attachment surface 18 that is positioned against the first attachment surface 15 of the conductive member, as shown in FIG. 3. The absorptive member 12 also includes an opposite surface 19 that is on the opposing side of the absorptive member from the second attachment surface 18.

Similar to the conductive member 11, the absorptive member 12 should not be viewed herein as necessarily limited to a particular shape or configuration. The absorptive member can be tailored to the shape of the conductive member 11 which is in turn preferably tailored to the size, shape and configuration of the electronics being shielded. In addition, the absorptive member 12 need not be a single piece of material, but could be a collection of associated material portions in contact, or not in contact, as long as the desired frequencies of EMI are shielded. As noted above, the illustrated embodiment is directed to a generally rectangular mobile phone, but other mobile phone shapes, mobile stations and electronic devices having different shapes could benefit from such variations.

Defined by the absorptive member 12 are a plurality of receptacles 20 that extend through the absorptive member between the surfaces 18 and 19. Through each of the receptacles 20 extends a respective one of the catches 17. In particular, each of the catches generally extends entirely through the absorptive member from the attachment surface 18 to emerge from the opposite surface 19.

Some of the catches 17 do not have a corresponding receptacle. As is shown in FIG. 2, four of the catches 17 extend outward from the first attachment surface 15 of the conductive member 11 along an outer edge 21 of the absorptive member 12. In particular, the four external catches 17 are in two opposing pairs, wherein one of the pairs brackets the shorter edges of the rectangularly shaped EMI shield and the other one of the pairs brackets the longer edges of the rectangularly shaped EMI shield. The bracketing pairs advantageously guard against shifting of the absorptive member 12 by abutting all four sides of its outer edge 21. In this embodiment, the catches disposed along the edge of the absorptive member do not necessarily extend through the absorptive member, but may instead be bent therearound. In contrast, the catches that extend through medial portions of the absorptive member general extend through corresponding receptacles, either preformed or formed by the catches themselves.

It should be noted that although a plurality of the catches 17 are illustrated restraining the absorptive member 12, as few as two generally opposite external catches, or one catch extending into one of the receptacles 20, may be enough to firmly hold the members 11, 12 together. For instance, a single one of the catches 17 with a non-circular shape may extend through one of the receptacles 20 and if tightly press fit therein, would restrain rotation and translation of the absorptive member 12 with respect to the conductive member 11. In another aspect, the catches 17 may have flanged ends that restrain the catches from becoming dislodged from the receptacles 20. For instance, the tips of the illustrated triangular shaped catches 17 may be bent over into general alignment with the opposite surface 19 of the absorptive member 12.

Figure 4:
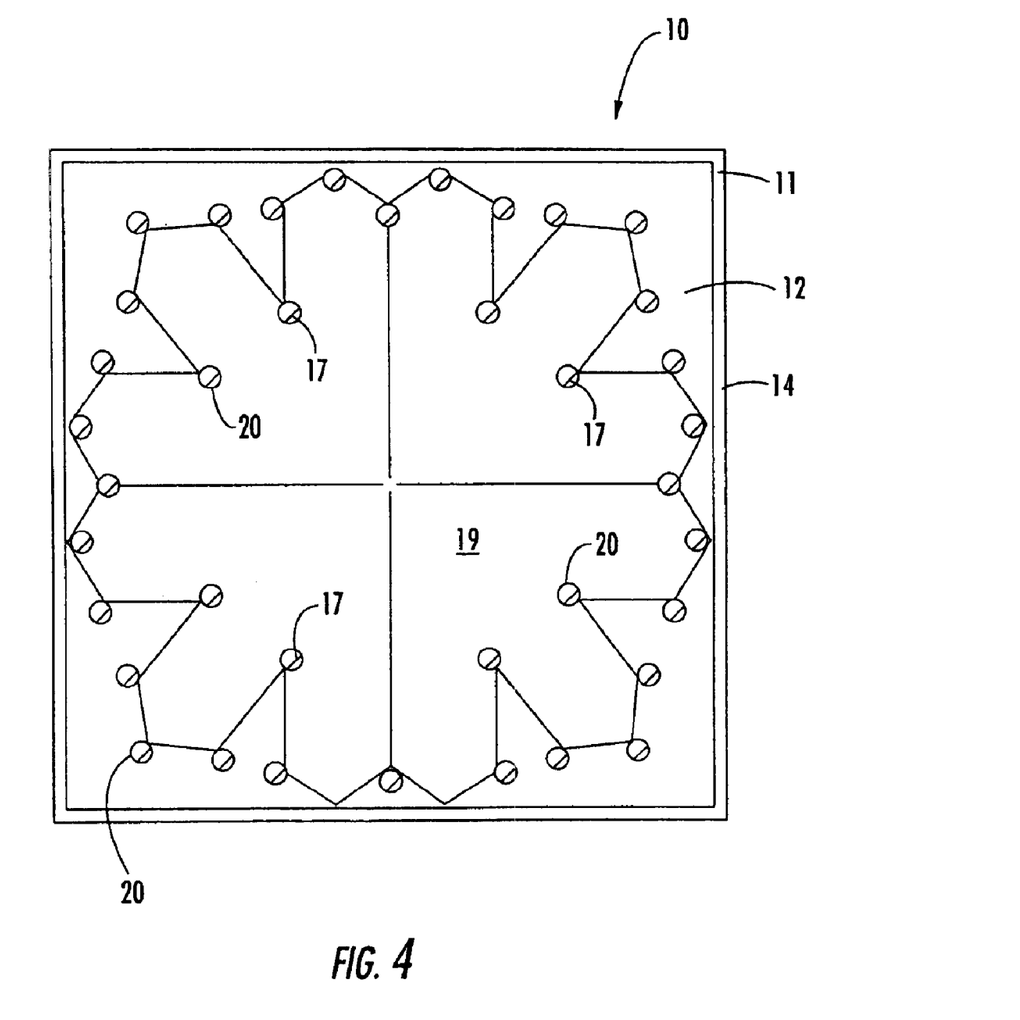
FIG. 4 is a plan view of an EMI shield of another embodiment of the present invention having defined therein a fractal pattern of grounded openings.

In another embodiment of the EMI shield 10 of the present invention, the plurality the receptacles 20 of the absorptive member 12 are positioned to correspond to a fractal pattern, as shown in FIG. 4. The catches 17 of the conductive member 11 are correspondingly positioned to extend into the receptacles 20. Generally, each catch forms a ground between the conductive member 11 and the absorptive member 12 so that one or more resonant frequencies are absorbed by the EMI shield 10. As the catches are added at the fractal pattern locations, each iteration presents more resonances to a constant frequency sweep of the absorptive member 12. In the illustrated embodiment, the fractal pattern is a Triadic Koch, but other fractal patterns may be employed. For instance, other Koch snowflakes and trees, Sierpinksi gaskets or monopoles and Hilbert curves, could be used to determine ground locations.

Preferably, the absorptive member 12 is constructed of material(s) so that it is sufficiently firm to support itself when positioned on the catches 17 and retains its solidity even at higher soldering temperatures. Soldering operations generate a range of temperatures, and due to the conductive nature of the conductive member 11, the exposure of the EMI shield 10 to these temperatures is longer-lasting than the exposure of the circuitry to which shield is being connected.

For instance, eutectic soldering (which uses lead) occurs at temperature ranges of 139° C. to 220° C. and for lead-free solders the temperature can range up to 260° C. Preferably, the melting temperature and the heat deflection temperature of the material used to construct the absorptive member 12 is in the range of, or exceeds, the maximum soldering temperatures. As a result, the absorptive member should retain enough structural rigidity at these higher temperatures to resist tearing under its own weight or deforming in such a way as to compromise its absorptive properties. For instance, the high temperatures should not adversely affect the electrical pathway between the catches 17 and the absorptive member 12.

In one embodiment, the absorptive member 12 is constructed of a thermoplastic or thermoset that can withstand the temperatures of the solder process. The thermoset or thermoplastic material can be processed in a mold tool using injection molding, compression molding or resin transfer molding. As another alternative, the absorbtive material can be processed as a film using heat and rolls to melt and form the material into relatively thin sheets.

The materials used for the absorptive member 12 may also include multiple non-homogenous layers laminated together. Still other examples include, a core layer sandwiched between two thin conductive layers, a conductive layer encased within a polymer matrix or a non-conductive mesh or cell structure coated with a conductive material. The conductive coating could include open or closed cell conductive foams.

In yet another example, the absorptive member 12 may be formed of a homogenous material, such as a conductive polymer having a chemical structure that exhibits the desired EMI absorptive properties. For instance, conductive epoxy materials, polyesters, polyamides, polyurethanes, liquid crystal polymers, polymer thick film inks, and mixtures of these materials may be used as conductive polymers.

The materials used for the absorptive member 12 can also have a composite structure with additional conductive and absorptive materials added to the polymer or other base material. For instance, the absorptive member may include carbon or powdered iron loaded into a silicon sheet. As another example, the absorptive material includes a conductive epoxy filled with a metal such as silver, copper, nickel, gold, platinum metals. In any event, both the conductive and absorptive members should be formed of conductive materials that provide various combinations of broad and selective shielding properties.

During manufacturing of the illustrated embodiment of the EMI shield 10, a sheet of conductive, malleable metal is cut into an appropriately sized blank which has edge portions that are bent in a common direction to form the peripheral wall structure 14 and base of the conductive member 11. A triangular punch is then driven through the base of the conductive member 11 from the soldering surface 16 to the first attachment surface 15 so that the triangular edges and tip of the catches 17 are bent away from the first attachment surface, as best shown in FIG. 3.

The absorptive member 12 is then positioned over and pressed onto the catches 17. As pressure is applied to the absorptive member 12, if receptacles are not preformed in the material the sharp point and edges of the triangular-shaped catches 17 cut into the material of the member so as to define the receptacles 20. Eventually, once the first and second attachment surfaces 15 and 18 of the members are in substantial contact, the ends of the catches 17 extend out of the opposite surface 19 of the absorptive member 12. In this manner, the receptacles 20 have an entrance end defined by the second attachment surface 18 and an exit end defined by the opposite surface 19. As an optional additional step, the ends of the catches 17 may be bent over into alignment with the opposite surface 19 of the absorptive member 12.

As an alternative to simultaneously attaching the members 11, 12 and defining the receptacles 20, the receptacles may be pre-cut and then aligned with the catches 17 for mounting. Cutting may be performed using various tools and methods, such as by die cutting, water jet drilling, laser drilling, bit drilling or ultrasonically cutting the receptacles 20 into the absorptive member. Once the receptacles are pre-cut, then the catches can be fit therein by bringing the attachment surfaces 15, 18 of the members 11, 12 together.

Once the members 11, 12 have been combined, the EMI shield 10 can be subjected to one of the above-described soldering processes so as to establish the electrical pathway to the electronic circuitry. Advantageously, the previous assembly steps are completed prior to soldering because unlike conventional shields, the EMI shield of the present invention can withstand the soldering temperatures of up to 260° C.

The EMI shield 10 of the present invention has many advantages. For example, the conductive member 11 is firmly attached to the absorptive member 12 using the catches 17 without the use of adhesives or coating and curing processes. In addition, the members 11, 12 can be assembled prior to the soldering processes in some embodiments because of the use of materials for the absorptive member that are tolerant of temperatures as high as 260° C. In addition, the structure and properties of the absorptive member 12 can be varied to selectively shield ranges of EMI frequencies necessary for sophisticated electronic devices, such as mobile stations. The particular structure of the triangular-shaped catches 17 of the illustrated embodiment also facilitates attachment without pre-cutting of receptacles 20 in the absorptive member, thereby simplifying the fabrication process.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An electromagnetic interference shield for blocking and dissipating electromagnetic interference, said shield comprising:
    a primary conductive member having a first attachment surface, said primary conductive member including at least one catch extending outwardly from the first attachment surface; and
    an absorptive member having a second attachment surface facing the first attachment surface, said absorptive member defining at least one receptacle;
    wherein the catch from the primary conductive member extends through the entrance into the receptacle of the absorptive member such that the absorptive member is capable of being firmly secured on the catch.

2. An electromagnetic interference shield of claim 1, wherein the absorptive member remains rigidly secured through a temperature range of 139° C. to 220° C.

3. An electromagnetic interference shield of claim 1, wherein the absorptive member remains rigidly secured through a temperature range of 139° C. to 260° C.

4. An electromagnetic interference shield of claim 1, wherein the primary conductive member has a plurality of the catches and the absorptive member defines a plurality of the receptacles each receiving a respective one of the catches.

5. An electromagnetic interference shield of claim 4, wherein the primary conductive member is a malleable sheet material and wherein the catches extend outwardly therefrom.

6. An electromagnetic interference shield of claim 4, wherein each of the catches has a relatively sharp edge capable of penetrating the absorptive member to form the receptacles therein.

7. An electromagnetic interference shield of claim 4, wherein the receptacles are pre-formed in the absorptive member.

8. An electromagnetic interference shield of claim 4, wherein the primary conductive member includes a polymer sheet preformed with the catches extending from the first attachment surface and wherein the polymer sheet is coated with a conductive material.

9. An electromagnetic interference shield of claim 4, wherein the catches extend entirely through the absorptive member to an opposite surface and are bent into approximate alignment with the opposite surface.

10. An electromagnetic interference shield of claim 1, wherein the absorptive member is constructed of a resin composite material having a combination of conductive and absorptive materials.

11. An electromagnetic interference shield of claim 1, wherein the absorptive member is constructed of a laminate material having layers of conductive material and layers of absorptive material.

12. An electromagnetic interference shield of claim 1, wherein the absorptive member is constructed of a conductive mesh encased within a polymer matrix.

13. An electromagnetic interference shield of claim 1, wherein the absorptive member is constructed of a non-conductive mesh encased within a conductive foam structure.

14. An electromagnetic interference shield for blocking and dissipating electromagnetic interference, said shield comprising:
    a primary conductive member having a first attachment surface, said primary conductive member including at least two catches extending outwardly from the first attachment surface; and
    an absorptive member having a second attachment surface facing the first attachment surface and at least two opposite edges;
    wherein each of the catches extends along a respective one of the opposite edges so as to hold the absorptive member between the catches.

15. An electromagnetic interference shield of claim 14, wherein the absorptive member remains rigidly secured through a temperature range of 139° C. to 260° C.

16. An electromagnetic interference shield of claim 14, wherein the primary conductive member has a plurality of the catches and the absorptive member defines a plurality of the receptacles each receiving a respective one of the catches.

17. An electromagnetic interference shield of claim 16, wherein the primary conductive member is a malleable sheet material and wherein the catches extend outwardly therefrom.

18. A mobile station, said mobile station comprising:
    an electronic circuit assembly;
    a primary conductive member having a first attachment surface, said primary conductive member including at least one catch extending outwardly from the first attachment surface and said primary conductive member connected via a conductive pathway to the electronic circuit assembly; and
    an absorptive member having a second attachment surface facing the first attachment surface, said absorptive member defining at least one receptacle;
    wherein the catch from the primary conductive member extends through the entrance into the receptacle of the absorptive member such that the absorptive member is capable of being firmly secured on the catch and wherein the primary conductive member and absorptive member together shield the electronic circuit assembly from electromagnetic interference.

19. A mobile station of claim 18, wherein the absorptive member remains rigidly secured through a temperature range of 139° C. to 260° C.

20. A mobile station of claim 18, wherein the primary conductive member has a plurality of the catches and the absorptive member defines a plurality of the receptacles each receiving a respective one of the catches.

21. A mobile station claim 20, wherein the primary conductive member is a malleable sheet material and wherein the catches extend outwardly therefrom.

22. A mobile station of claim 21, wherein each of the catches has a relatively sharp edge capable of penetrating the absorptive member to form the receptacles therein.

23. An electromagnetic interference shield for blocking and dissipating electromagnetic interference, said shield comprising:
    a primary conductive member having a first attachment surface;
    an absorptive member having a second attachment surface facing the first attachment surface, said absorptive member defining a plurality of openings positioned to form a fractal pattern; and
    a plurality of ground connections electrically connecting the absorptive member to the primary conductive member, each of said ground connections positioned at a respective one of the plurality of openings forming the fractal pattern.

24. An electromagnetic interference shield of claim 23, wherein each of the ground connections includes a catch extending from the primary conductive member into the respective opening.

25. An electromagnetic interference shield of claim 24, wherein the primary conductive member is a malleable sheet material and wherein the catches extend outwardly therefrom.

26. An electromagnetic interference shield of claim 25, wherein each of the catches has a relatively sharp edge capable of penetrating the absorptive member to form the receptacles therein.

* * * * *